United States Patent
Chen et al.

(10) Patent No.: US 6,429,460 B1
(45) Date of Patent: Aug. 6, 2002

(54) HIGHLY LUMINOUS LIGHT EMITTING DEVICE

(75) Inventors: Tzer-Perng Chen, Hsinchu; Chih-Sung Chang, Taipei; Chih-Li Chiang, Taichung, all of (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 09/675,341

(22) Filed: Sep. 28, 2000

(51) Int. Cl.$^7$ .................. H01L 27/15; H01L 31/12; H01L 33/00

(52) U.S. Cl. .................. 257/79; 257/94; 438/22

(58) Field of Search .................. 257/13, 94, 96, 257/98, 99, 79, 93, 103; 438/22

(56) References Cited

U.S. PATENT DOCUMENTS

| | | | |
|---|---|---|---|
| 4,038,580 A | | 7/1977 | Porret |
| 4,053,914 A | | 10/1977 | Goodwin |
| 5,477,063 A | * | 12/1995 | Shakuda ............... 257/94 |
| 5,488,235 A | * | 1/1996 | Nozaki et al. .......... 257/94 |
| 5,834,325 A | * | 11/1998 | Motoki et al. ......... 257/13 |
| 5,861,636 A | * | 1/1999 | Dutta et al. ........... 257/99 |
| 5,909,051 A | * | 6/1999 | Stockman et al. ...... 257/96 |
| 6,277,665 B1 | * | 1/2000 | Ma et al. ............... 257/98 |
| 6,246,078 B1 | * | 6/2001 | Sasaki et al. .......... 257/96 |

OTHER PUBLICATIONS

I. Schnitzer, E. Yablonovitch, C. Caneau, and T. J. Gmitter; "Ultrahigh spontaneous emission quantum efficiency, 99.7% internally and 72% externally, from AIGaAs/GaAs/AIGaAs double heterostructures"; 1993 American Institute of Physics, pp. 131–133.

I. Schnitzer and E. Yablonovitch; "30% external quantum efficiency from surface textured, thin–film light–emitting diodes"; 1993 American Institute of Physics, pp. 2174–2176.

Naoki Wada, Shiro Sakai, Shinichi Yoshimi, Yoshihiro Shintani and Masuo Fukui; "GaAs/AlGaAs Light Emitters Fabricated on Undercut GaAs on Si"; Mar. 1994, Jpn. J. Appl. Phys. vol. 33 (1994) pp. 1268–1274.

R. Windisch, P. Heremans, A. Knobloch, P. Kiesel, G.H. Dohler, B. Dutta and G. Borgh; "Light–emitting diodes with 31% external quantum efficiency by outcoupling of lateral waveguide modes"; Apr. 19, 1999, Applied Physics Letters, vol. 74, No. 16, pp. 2256–2258.

* cited by examiner

Primary Examiner—David Nelms
Assistant Examiner—Andy Huynh
(74) Attorney, Agent, or Firm—Birch, Stewart, Kolasch & Birch, LLP

(57) ABSTRACT

The present invention discloses a light emitting device which includes a substrate, a light emitting layer on the substrate, a current restriction layer on the light emitting layer, a current spreading layer on the current restriction layer, a dielectric layer on the current spreading layer defining an exposed area, a top ohmic contact metal layer on the exposed area, and a bottom ohmic contact metal layer under the substrate. The current spreading layer has a rough top surface. The current restriction layer includes a conductive layer that allows current to flow through, and an insulating layer around the conductive layer. The insulating layer prohibits the current from flowing through in a path between the top ohmic contact metal layer and the bottom ohmic contact metal layer. The substrate is partially removed to form a cavity for avoiding substrate absorption. A highly luminous light emitting device is obtained by introductions of the rough top surface of the current spreading layer, partial removal of the substrate, the current restriction layer, and optimal layouts of the top and bottom ohmic contact metal layers and the conductive layer.

11 Claims, 3 Drawing Sheets

HIGHLY LUMINOUS LIGHT EMITTING DEVICE

BACKGROUND OF THE INVENTION

1. Field of the Invention

The present invention relates to a light emitting device, and more particularly, to a highly luminous light emitting device such as a light emitting diode.

2. Description of the Prior Art

Light emitting diodes with high external quantum efficiency are energy saving devices and have potential for totally replacing incandescent lamps in applications such as traffic signals and automotive lighting in the near future.

External quantum efficiency of a light emitting diode (LED) is given by the product of internal quantum efficiency and extraction efficiency. The internal quantum efficiency is determined by the material property and quality. Direct bandgap III–V semiconductor light emitting diodes which can be formed with good carrier confinement double heterostructure are normally high in the internal quantum efficiency and, however, quite low in the external quantum efficiency due to absorption and internal reflection. The extraction efficiency is the part of the generated light that can escape from a LED chip into ambient air or encapsulating epoxy. Normally the LED chip has a much higher index of refraction, typically 3.4 compared with 1.0 for air and approximately 1.5 for epoxy. Because a critical angle for internal reflection is given by the Snell's law, this results in a critical angle of 17 degrees for air and 26 degrees for epoxy. Therefore, only the portion of light that emits at an angle less than the critical angle can escape from the LED chip. For most of the semiconductor LEDs, the critical angles are quite small. Most of the light generated at the P/N junction will be totally reflected back and be finally absorbed inside the LED chips.

Attempts have been made to reduce the total internal reflection and subsequent absorption by separating optically thin double heterostructures from the substrate by epitaxial liftoff technique and mounting the heterostructures on a high reflectivity mirror, and texturing the thin-film surface as described in: (1) "Ultrahigh spontaneous emission quantum efficiency, 99.7% internally and 72% externally, from AlGaAs/GaAs/AlGaAs double heterostructures", I. Schnitzer, E. Yablonovitch, C. Caneau, and T. J. Gmitter, Appl. Phys. Lett. 62(2), Jan. 11, 1993, page 131–133; (2) "30% External quantum efficiency from surface textured, thin-film light emitting diodes" I. Schnitzer and E. Yablonovitch, C. Caneau, T. J. Gmitter, and A. Scherer, Appl. Phys. Lett. 63(16); Oct. 18, 1993, page 2174–2176; and (3) "Light emitting diodes with 31% external quantum efficiency by outcoupling of lateral waveguide modes", R. Windisch, P. Heremans, A. Knobloch, P. Kiesel, G. H. Dohler, B. Dutta and G. Borghs, Appl. Phys. Lett. 74(16), Apr. 19, 1999, page 2256–2258. Although the extraction efficiency is improved, however, the epitaxial lift-off technique is not suitable for low cost mass production due to the difficulties in handling such a thin-film LED structure. The thin-film structure is susceptible to breaking into several small pieces during LED chip fabrication process since the thickness thereof is only a few micrometers.

U.S. Pat. No. 4,038,580 discloses a GaAsP electroluminescent diode having a luminous surface defined by a thinned portion comprising zones with emitting junctions, the zones occupying only a portion of the luminous surface. Although this LED structure is more robust, however, a high yield and reliability are not easy to achieve in fabricating this GaAsP LED. The reasons are: Firstly, the density of current flowing through the emitting junctions is high and the LED reliability is susceptible to being reduced. A large portion of zones 4 and 5 on the thinned portion is removed so as to avoid absorption of the light generated at the emitting junctions during light passage thereof through zone 5. Therefore, the emitting junctions are quite limited in area and consequently high in current density. And secondly, a sandblasting process applied to roughen an undersurface of the thinned portion will damage the thinned portion since which is only about 15 to 40 μm thick. The sandblasting process would also reduce the LED reliability performances.

SUMMARY OF THE INVENTION

The present invention discloses a highly luminous light emitting device which includes a substrate, a light emitting layer on the substrate, a current restriction layer on the light emitting layer, a current spreading layer on the current restriction layer, a dielectric layer on the current spreading layer defining an exposed area, a top ohmic contact metal layer on the exposed area, and a bottom ohmic contact metal layer under the substrate. The current spreading layer has a rough top surface. The current restriction layer includes a conductive layer that allows current to flow through, and an insulating layer around the conductive layer. The insulating layer prohibits the current from flowing through in a path between the top ohmic contact metal layer and the bottom ohmic contact metal layer.

The light being blocked is minimized by leading the current to flow in a path from the top ohmic contact metal layer to the bottom ohmic contact metal layer with the restriction of the current restriction layer. And, chances of the light leaving the light emitting device is further increased due to change of the light propagation paths by the rough top surface, which acts as a light emission surface of the light emitting device, of the current spreading layer.

In an embodiment, the light emitting device further includes an etching stop layer between the light emitting layer and the substrate, a cavity substantially in the center of the substrate, and a lower metal layer. The cavity defines a surface and the lower metal layer is formed on the surface. The cavity formed by partially removal of the substrate reduces the substrate absorption.

In an embodiment, the light emitting device further includes a lower confining layer, an upper confining layer, and an active layer sandwiched in between the lower confining layer and the upper confining layer.

By introductions of the rough top surface of the current spreading layer, partial removal of the substrate, the current restriction layer, and optimal layouts of the top and bottom ohmic contact metal layers and the conductive layer, a highly luminous light emitting device of the present invention is obtained.

BRIEF DESCRIPTION OF THE DRAWINGS

FIG. 1b is a sectional view taken along the I—I line of the light emitting device shown in FIG. 1a.

DETAILED DESCRIPTION OF THE INVENTION

Figure 1A:
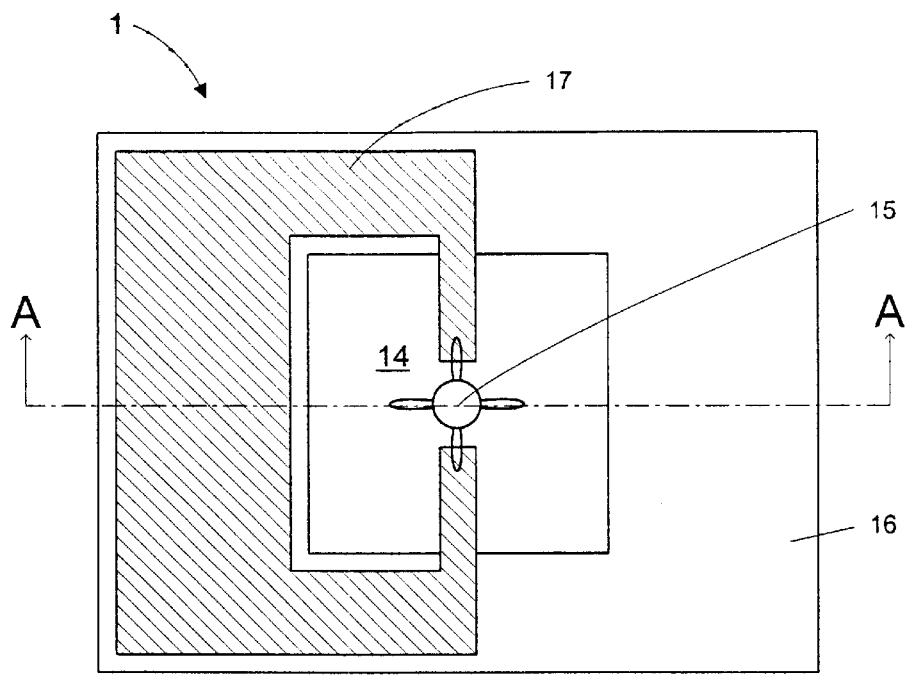
FIG. 1a is a top view of a light emitting device according to the first embodiment of the present invention.
Figure 1B:
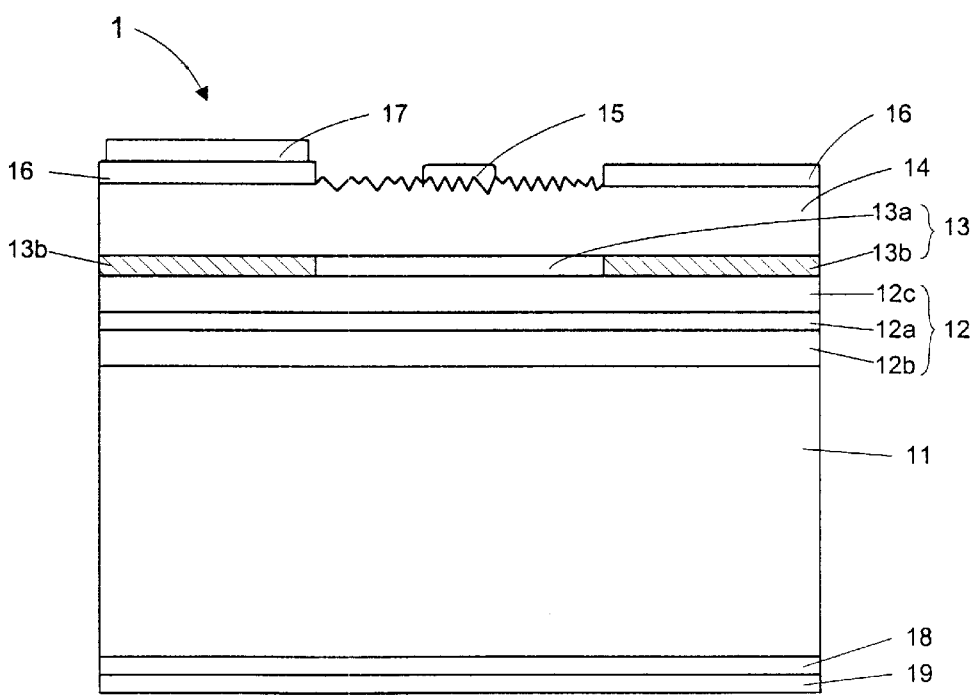

Please refer to FIGS. 1a and 1b, which are a top view and a sectional view of a light emitting device 1 respectively. The light emitting device 1, e.g. a light emitting diode, includes a substrate 11 and a light emitting layer 12 on the substrate 11. A current restriction layer 13 is formed on the light emitting layer 12. The current restriction layer 13 includes a conductive layer 13a that allows current to flow through, and an insulating layer 13b around the conductive layer 13a.

A current spreading layer 14, which is made of AlGaAs, GaP or GaAsP, is further formed on the current restriction layer 13. The current spreading layer 14 has a rough top surface. The top surface of the current spreading layer 14 is preferably made roughened by etching, e.g. wet chemical etching or reactive ion etching, rather than by sandblasting.

The current restriction layer 13 is formed by depositing a layer of a doped compound semiconductor material allowing current to flow through, e.g. $Al_xGa_{1-x}As$ wherein $1.0 \geq x \geq 0.9$, and then, after one or more covering layers on the current restriction layer 13 are deposited, e.g. the current spreading layer 14, oxidizing an outer portion of the layer. The oxidized outer portion of the layer becomes the insulating layer 13b and an inner portion of the layer that is not oxidized becomes the conductive layer 13a.

The light emitting device 1 further includes a dielectric layer 16 on the current spreading layer 14. The dielectric layer 16 defines an exposed area of the current spreading layer 14, which acts as a light emission area of the light emitting device 1. The rough top surface of the current spreading layer 14 allows light from the light emitting layer 12 to change propagation paths and have more chances of escaping from the light emitting device 1.

A top ohmic contact metal layer 15 is formed on the exposed area of the current spreading layer 14. The top ohmic contact metal layer 15 is substantially in the center of the light emission area and is limited in size to avoid blocking light. The light emitting device 1 further includes a bottom ohmic contact metal layer 18 under the substrate 11.

A maximum of emission light intensity of the light emitting device 1 is achieved by the optimal layouts of the top ohmic contact metal layer 15, the current restriction layer 13, the light emitting layer 12 and the bottom ohmic contact metal layer 18. When potential difference is applied between the top ohmic contact metal layer 15 and the bottom ohmic contact metal layer 18, current flows through the conductive layer 13a. However, the insulating layer 13b prohibits the current from flowing through. Therefore, an effective light emitting area of the light emitting device 1 is restricted within an area of the conductive layer 13a. In a preferred embodiment, the conductive layer 13a is of a size substantially the same as the exposed area of the current spreading layer 14. Furthermore, since the current does not flow through the insulating layer 13b, light is barely generated from the area of the insulating layer 13b, which is otherwise mostly blocked by the dielectric layer 16. The most of light is capable of escaping from the light emitting device 1 through the emission area since the effective light emitting area 13a is substantially right below the emission area. The most of current is efficiently utilized to generate light. And since the area of the conductive layer 13a is not necessarily limited, the current density is under control not to exceed a higher limit. A highly luminous light emitting device 1 is thus obtained.

In an embodiment, also shown in FIGS. 1a and 1b, the light emitting device 1 further includes a bonding pad 17 on the dielectric layer 16. The bonding pad 17 is preferably extending over the current spreading layer 14 to connect the top ohmic contact metal layer 15. The bonding pad 17 is limited in area especially for the part above the exposed area of the current spreading layer 14 so as to minimize blocking light. In another embodiment, the light emitting device 1 further includes a lower metal layer 19 under the bottom ohmic contact metal layer 18.

The light emitting layer 12 can be a double heterostructure structure or a multiple quantum well structure. In an embodiment, the light emitting layer 12 further includes a lower confining layer 12b, an upper confining layer 12c, and an active layer 12a sandwiched in between the lower confining layer 12b and the upper confining layer 12c. The active layer 12a is made of AlGaAs or AlGaInP.

Figure 2:
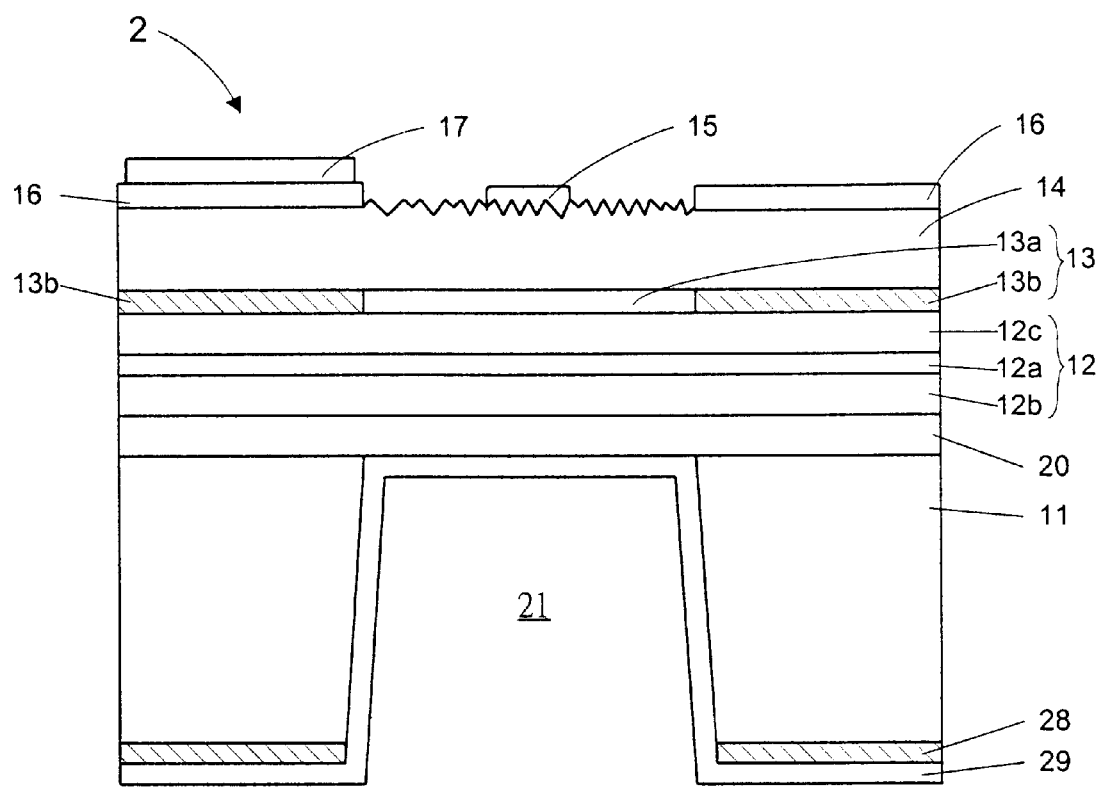
FIG. 2 is a sectional view of a light emitting device according to the second embodiment of the present invention.

Please refer to FIG. 2, which is a sectional view of a light emitting device 2. The light emitting device 2 is substantially the same as the light emitting device 1, except that the light emitting device 2 further includes an etching stop layer 20 between the light emitting layer 12 and the substrate 11, a cavity 21 substantially in the center of the substrate 11, and a lower metal layer 29. The etching stop layer 20 is made of AlGaAs, InGaP or AlGaInP and protects the light emitting layer 12 from damage during an etching step in the formation of the cavity 21. The etching step is applied by reactive ion etching or wet chemical etching. The cavity 21 defines a surface and the lower metal layer 29 is formed on the surface and under a bottom ohmic contact metal layer 28. The bottom ohmic contact metal layer 28 is under the substrate 11. The cavity 21, formed by partially removal of the substrate 11, minimizes substrate light absorption. And the light is totally reflected upwardly to the light emission area by the lower metal layer 29.

Figure 3:
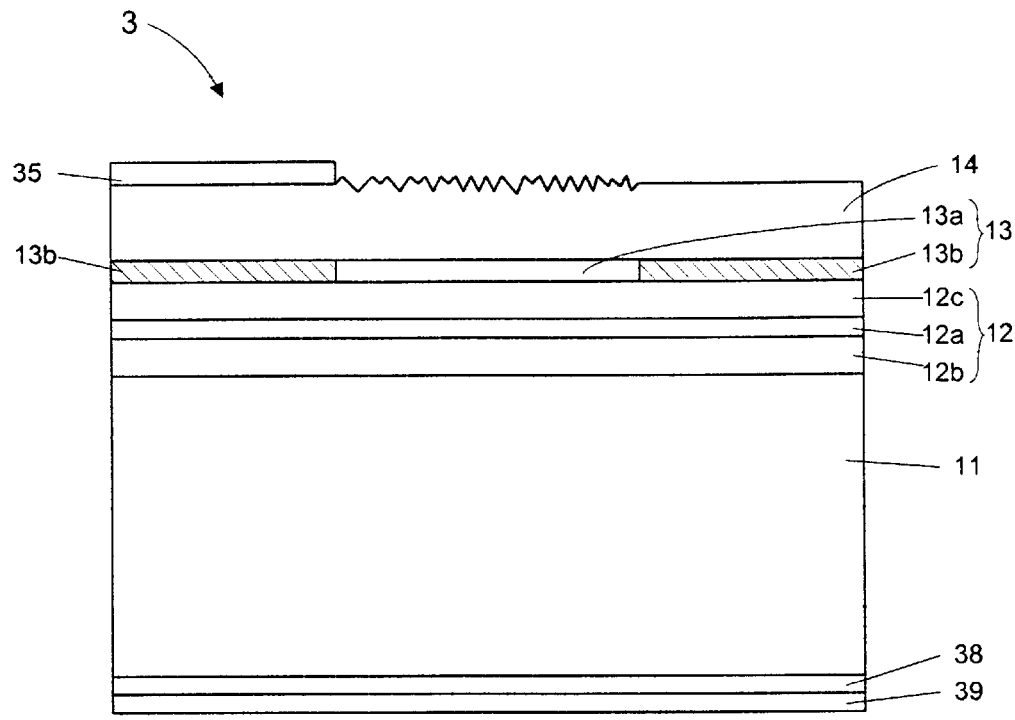
FIG. 3 is a sectional view of a light emitting device according to the third embodiment of the present invention.

Please refer to FIG. 3, which is a sectional view of a light emitting device 3. The light emitting device 3 is substantially the same as the light emitting device 1. The differences lie in that the light emitting device 3 does not include a dielectric layer and that a top ohmic contact metal layer 35 is formed directly on one side of the current spreading layer 14. The top ohmic contact metal layer 35 can also serve as a bonding pad. The light emitting device 3 includes a bottom ohmic contact layer 38 under the substrate 11.

When potential difference is applied between the top ohmic contact metal layer 35 and the bottom ohmic contact metal layer 38, current flows along a path between the top ohmic contact metal layer 35 and the bottom ohmic contact metal layer 38 through the conductive layer 13a. The light emitting device 3 has the same advantages with the light emitting device 1, e.g. the most of light generated within a limited area of the conductive layer 13a is capable of escaping from the light emitting device 3 through the light emission area. The light emitting device 3 has a further advantage, i.e. the light emission area is not blocked since the top ohmic contact metal layer 35 is moved to the side of the current spreading layer 14.

In an embodiment, also shown in FIG. 3, the light emitting device 3 further includes a lower metal layer 39 under the bottom ohmic contact metal layer 38.

Figure 4:
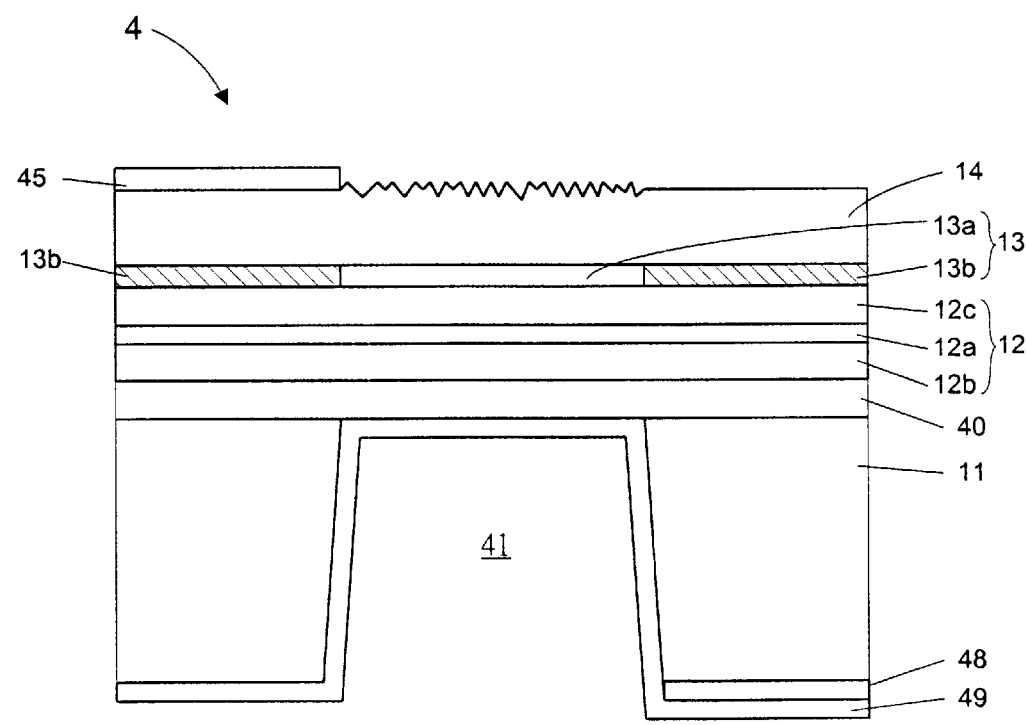
FIG. 4 is a sectional view of a light emitting device according to the fourth embodiment of the present invention.

Please refer to FIG. 4, which is a sectional view of a light emitting device 4. The light emitting device 4 is substantially the same as the light emitting device 3, except that the light emitting device 4 further includes an etching stop layer 40 between the light emitting layer 12 and the substrate 11, a cavity 41 substantially in the center of the substrate 11, and a lower metal layer 49. The etching stop layer 40 is made of AlGaAs, InGaP or AlGaInP. A bottom ohmic contact metal layer 48 is on a side of the substrate 11 opposite to a top ohmic contact metal layer 45. The cavity 41 defines a surface. The lower metal layer 49 is formed on the surface and under the bottom ohmic contact metal layer 48.

EXAMPLE 1

A 650 nm AlGaAs light emitting diode is provide. First, an n-type etching stop layer is formed on an n-type GaAs substrate of an epitaxial wafer. The etching stop layer can be any III–V compound semiconductor materials that have lattice constant nearly the same as the GaAs material and at the same time have an etching rate much lower than the GaAs material. The etching stop layer is better to have a bandgap larger than the bandgap of the active layer to avoid light absorption. If the bandgap of the etching stop layer is smaller than the bandgap of the active layer, the etching stop layer needs to be removed during chip process or the thickness must be lowered to reduce light absorption. N-type InGaP or AlGaAs materials with high aluminum content are good candidates as the etching stop layers. Thereafter, an n-type $Al_xGa_{1-x}As$ lower confining layer, an $Al_yGa_{1-y}As$ active layer, and a p-type $Al_xGa_{1-x}As$ upper confining layer are formed in sequence on the etching stop layer. To emit light of 650 nm wavelength, the y in the active layer is about 35%. Further, the x in both the lower and upper confining layers must be larger than y of the active layer. In order to have better carrier confinement, the x in both the lower and upper confining layers must be larger than 60%. A p-type $Al_zGa_{1-z}As$ layer, wherein z is between 0.9 and 1.0, is then grown on the upper confining layer. Finally, a p-type high bandgap current spreading layer is grown on the $Al_zGa_{1-z}As$ layer. This current spreading layer can be any III–V compound semiconductor materials that are higher in bandgap and lower in resistivity than the active layer. For example, low resistivity p-type GaP and $Al_mGa_{1-m}As$ with m larger than 50% are good candidates.

After crystal growth, the epitaxial wafer is then processed into a plurality of LED chips according to the following steps.

(1) Depositing a $SiO_2$ or $Si_3N_4$ dielectric layer on the top surface of the epitaxial wafer by plasma enhanced chemical vapor deposition (PECVD).
(2) Removing a part of the dielectric layer to define an exposed area of the current spreading layer by chemical etching using photoresist as a mask.
(3) Roughening the top surface of the exposed area of the current spreading layer by chemical etching.
(4) Depositing and annealing a small top ohmic contact metal layer on the exposed area of the current spreading layer.
(5) Depositing a p-type bonding pad metal layer on the dielectric layer to connect the top ohmic contact metal layer.
(6) Either etching or sawing the edges of each chip through the p-type $Al_zGa_{1-z}As$ layer.
(7) Loading the epitaxial wafer into a furnace with water vapor flowing inside to oxidize part of the p-type $Al_zGa_{1-z}As$ layer, the oxidized part becoming an insulating layer and the other part becoming a conductive layer.
(8) Thinning down the back surface of the GaAs substrate to about 100–150 µm.
(9) Depositing and annealing a bottom ohmic contact metal layer under the substrate.
(10) Removing the central portion of the GaAs substrate to form a cavity by reactive ion etching using photoresist as a mask.
(11) Depositing a lower metal layer having high reflectivity on the whole back side surface of the wafer.
(12) Finally, dividing the wafer into several individual chips.

EXAMPLE 2

A 560–650 nm AlGaInP light emitting diode is provided. First, an n-type etching stop layer is formed on an n-type GaAs substrate of an epitaxial wafer. The etching stop layer can be any III–V compound semiconductor materials that have lattice constant nearly the same as the GaAs material and at the same time have an etching rate much slower than the GaAs material. The etching stop layer is better to have a bandgap larger than the bandgap of the active layer to avoid light absorption. If the bandgap of the etching stop layer is smaller than the bandgap of the active layer, the etching stop layer needs to be removed during chip process or the thickness must be lowered to reduce light absorption. N-type (AlGa)InP or AlGaAs materials with high aluminum content are good candidates as the etching stop layers. Thereafter, an n-type $(Al_xGa_{1-x}As)InP$ lower confining layer, an $(Al_yGa_{1-y}As)InP$ active layer, and a p-type $(Al_xGa_{1-x}As)InP$ upper confining layer are formed in sequence on the etching stop layer. To emit light of 650 nm wavelength, the y in the active layer is about 0%. The active layer can be a single bulk layer with thickness about 0.1–2 µm or a multiple quantum well (MQW) structure. Further, the x in both the lower and upper confining layers must be larger than the y in the active layer. In order to have better carrier confinement, the x in both the lower and upper confining layers must be larger than 50%. A p-type $Al_zGa_{1-z}As$ layer, wherein z is between 0.9 and 1.0, is then grown on the upper confining layer. Finally, a p-type high bandgap current spreading layer is grown on the $Al_zGa_{1-z}As$ layer. This current spreading layer can be any III–V compound semiconductor materials that are higher in bandgap and lower in resistivity than the active layer. For example, low resistivity p-type GaP, GaAsP, InGaP, AlGaInP and $Al_mGa_{1-m}As$ with m larger than 60% are good candidates.

After crystal growth, the epitaxial wafer is then processed into a plurality of LED chips according to the following steps.

(1) Roughening the top surface of the current spreading layer by chemical etching with photoresist serving as a mask to define an exposed area of the current spreading layer.
(2) Depositing and annealing a top ohmic contact metal layer such as AuBe on a side of the current spreading layer.
(3) Thinning down the back surface of the GaAs substrate to a thickness of about 100 to 150 µm.
(4) Either etching or sawing the edges of each chip through the p-type $Al_zGa_{1-z}As$ layer of the epitaxial wafer.
(5) Oxidizing part of the p-type $Al_zGa_{1-z}As$ layer in ambient oxygen, the oxidized part becoming an insulating layer and the other part becoming a conductive layer.
(6) Depositing and annealing a bottom ohmic contact metal layer such as AuGeNi under the substrate.
(7) Removing the central portion of the GaAs substrate to form a cavity by reactive ion etching using photoresist as a mask.
(8) Depositing a lower metal layer that has high reflectivity in the wavelength range from 560–650 nm on the whole backside surface of the wafer. The thickness of the lower metal layer can be very thick, for example 10 µm, to help heat dissipation.

(9) Finally, dividing the wafer into several individual chips.

The luminous intensity of the light emitting diode according to the preferred embodiments of the present invention is higher than that of the conventional LED.

Additional advantages and modifications of the invention will be easily understood to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light emitting device, comprising:

a substrate;

a light emitting layer on the substrate;

a current restriction layer on the light emitting layer, the current restriction layer comprising a conductive layer allowing current to flow through, and an insulating layer around the conductive layer;

a current spreading layer on the current restriction layer, the current spreading layer having a rough top surface;

a dielectric layer on the current spreading layer, defining an exposed area of the current spreading layer;

a top ohmic contact metal layer on the exposed area of the current spreading layer; and a bottom ohmic contact metal layer under the substrate;

wherein the insulating layer prohibits the current from flowing through along a path between the top ohmic contact metal layer and the bottom ohmic contact metal layer.

2. The light emitting device of claim 1, further comprising a bonding pad on the dielectric layer.

3. The light emitting device of claim 2, wherein the bonding pad extends over the current spreading layer to connect the top ohmic contact metal layer.

4. The light emitting device of claim 1, wherein the conductive layer is of a size substantially the same as the exposed area of the current spreading layer.

5. The light emitting device of claim 1, further comprising a lower metal layer under the bottom ohmic contact metal layer.

6. The light emitting device of claim 1, further comprising an etching stop layer between the light emitting layer and the substrate, a cavity substantially in the center of the substrate, and a lower metal layer; wherein the cavity defines a surface and the lower metal layer is formed on the surface and under the bottom ohmic contact metal layer.

7. The light emitting device of claim 1, wherein the light emitting layer further comprises a lower confining layer, an upper confining layer, and an active layer sandwiched in between the lower confining layer and the upper confining layer.

8. A light emitting device, comprising:

a substrate;

a light emitting layer on the substrate;

a current restriction layer on the light emitting layer, the current restriction layer comprising a conductive layer allowing current to flow through, and an insulating layer around the conductive layer;

a current spreading layer on the current restriction layer, the current spreading layer having a rough top surface;

a top ohmic contact metal layer on one side of the current spreading layer; and a bottom ohmic contact metal layer under the substrate;

wherein the insulating layer prohibits the current from flowing through along a path between the top ohmic contact metal layer and the bottom ohmic contact metal layer.

9. The light emitting device of claim 8, further comprising a lower metal layer under the bottom ohmic contact metal layer.

10. The light emitting device of claim 8, further comprising an etching stop layer between the light emitting layer and the substrate, a cavity substantially in the center of the substrate, and a lower metal layer; wherein the bottom ohmic contact metal layer is on a side of the substrate opposite to the top ohmic contact metal layer, the cavity defines a surface, and the lower metal layer is formed on the surface and under the bottom ohmic contact metal layer.

11. The light emitting device of claim 8, wherein the light emitting layer further comprises a lower confining layer, an upper confining layer, and an active layer sandwiched in between the lower confining layer and the upper confining layer.

* * * * *